(12) United States Patent
Choi

(10) Patent No.: US 7,745,287 B2
(45) Date of Patent: Jun. 29, 2010

(54) FLOATING TRAP TYPE NONVOLATILE MEMORY DEVICE AND METHOD OF FABRICATING THE SAME

(75) Inventor: Jeong-Hyuk Choi, Yongin-shi (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 11/039,889

(22) Filed: Jan. 24, 2005

(65) Prior Publication Data

US 2005/0130373 A1    Jun. 16, 2005

Related U.S. Application Data

(62) Division of application No. 10/407,182, filed on Apr. 7, 2003, now Pat. No. 6,861,685.

(30) Foreign Application Priority Data

Apr. 15, 2002   (KR) ................ 2002-20344

(51) Int. Cl.
*H01L 21/336* (2006.01)
(52) U.S. Cl. ...................... 438/259; 257/302
(58) Field of Classification Search ......... 438/257, 438/259
See application file for complete search history.

(56) References Cited

U.S. PATENT DOCUMENTS

| | | | | |
|---|---|---|---|---|
| 5,460,989 | A * | 10/1995 | Wake ................... | 438/259 |
| 5,825,069 | A * | 10/1998 | Wen et al. ............. | 257/390 |
| 5,838,041 | A  | 11/1998 | Sakagami et al. ....... | 257/324 |
| 5,999,444 | A  | 12/1999 | Fujiwara et al. ....... | 365/185.02 |
| 6,191,459 | B1 * | 2/2001 | Hofmann et al. ........ | 257/390 |
| 6,486,028 | B1 * | 11/2002 | Chang et al. .......... | 438/259 |
| 6,534,820 | B2 * | 3/2003 | Hofmann et al. ........ | 257/315 |
| 6,541,326 | B2 | 4/2003 | Fujiwara .............. | 438/211 |
| 6,555,435 | B2 * | 4/2003 | Chiang et al. ......... | 438/279 |
| 6,577,533 | B2 * | 6/2003 | Sakui et al. .......... | 365/185.05 |
| 6,754,105 | B1 * | 6/2004 | Chang et al. .......... | 365/185.18 |
| 6,878,988 | B1 * | 4/2005 | Lee et al. ............ | 257/324 |

(Continued)

FOREIGN PATENT DOCUMENTS

JP   2001-077219   3/2001

*Primary Examiner*—Steven Loke
*Assistant Examiner*—David Goodwin
(74) *Attorney, Agent, or Firm*—Harness, Dickey & Pierce PLC

(57) ABSTRACT

A nonvolatile memory device includes a semiconductor wall having an inclination angle and a gate electrode covered with the semiconductor wall. A pair of buried diffusion layers may be formed at a lower surface and upper surface formed by the semiconductor wall. A charge trap insulating layer may be sandwiched between the gate electrode and the semiconductor wall. The semiconductor wall between the buried diffusion layers may correspond to a channel of the memory device. In a method of fabricating the memory device, a pattern having a sidewall may be formed on a semiconductor substrate. A buried oxide layer may be formed at the upper surface and another buried oxide layer may be formed at the lower surface. A charge trap insulating layer may be formed at the sidewall where the buried oxide layers are formed. A gate electrode may be formed on the charge trap insulating layer. A semiconductor substrate may be formed to form a trench, so that the sidewall may be obtained.

16 Claims, 28 Drawing Sheets

U.S. PATENT DOCUMENTS

| | | | |
|---|---|---|---|
| 6,885,060 B2* | 4/2005 | Nomoto et al. | 257/324 |
| 6,916,715 B2* | 7/2005 | Hsiao et al. | 438/275 |
| 7,034,356 B2* | 4/2006 | Nomoto et al. | 257/324 |
| 7,038,271 B2* | 5/2006 | Nomoto et al. | 257/324 |
| 2002/0137288 A1* | 9/2002 | Nomoto et al. | 438/261 |
| 2004/0097036 A1* | 5/2004 | Hsiao et al. | 438/257 |
| 2004/0232471 A1* | 11/2004 | Shukuri | 257/314 |
| 2004/0232472 A1* | 11/2004 | Sakui et al. | 257/314 |
| 2005/0196923 A1* | 9/2005 | Deppe et al. | 438/259 |

* cited by examiner

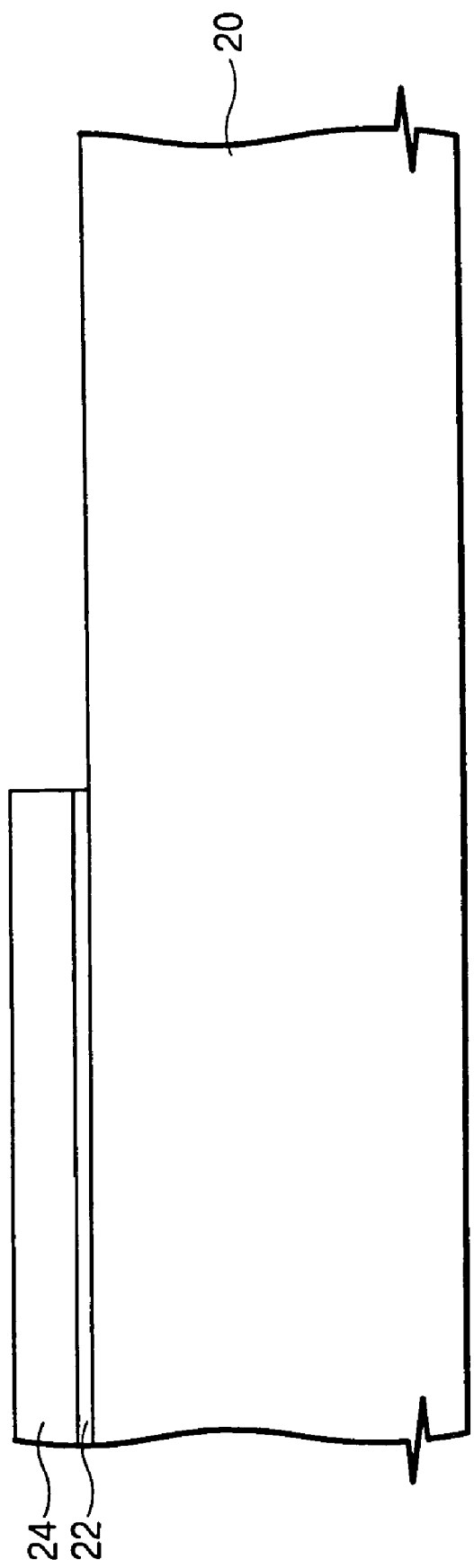

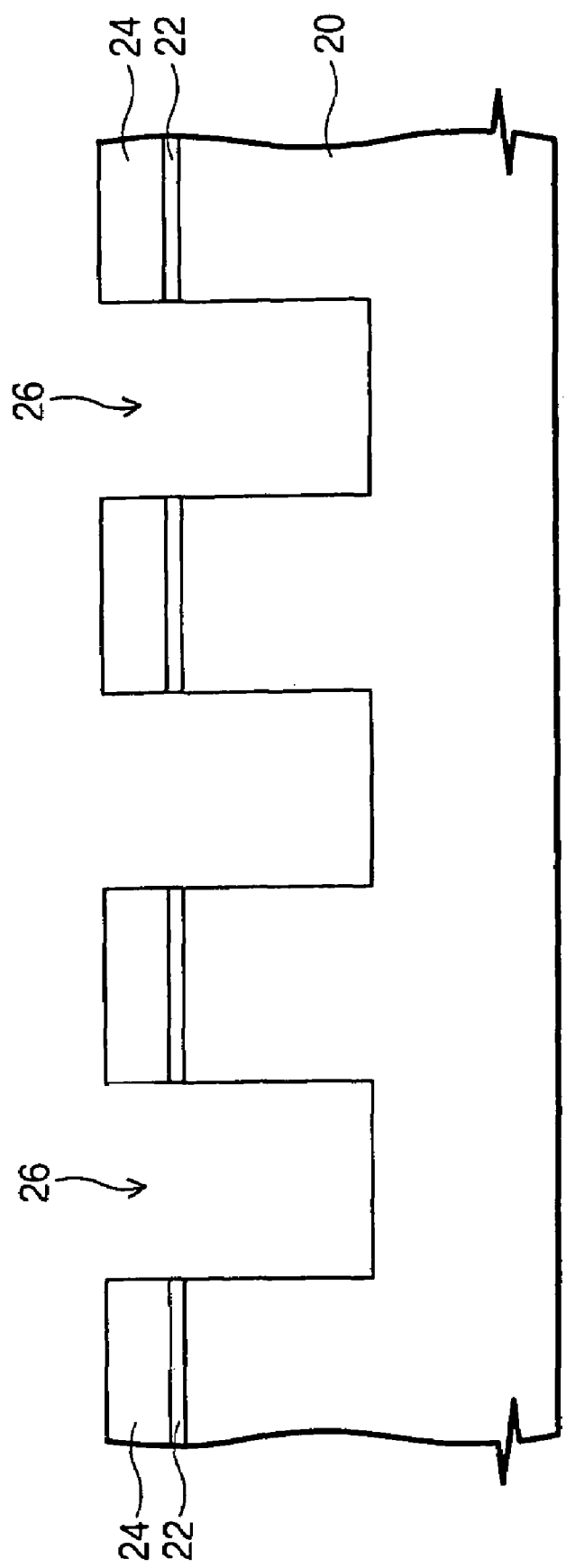

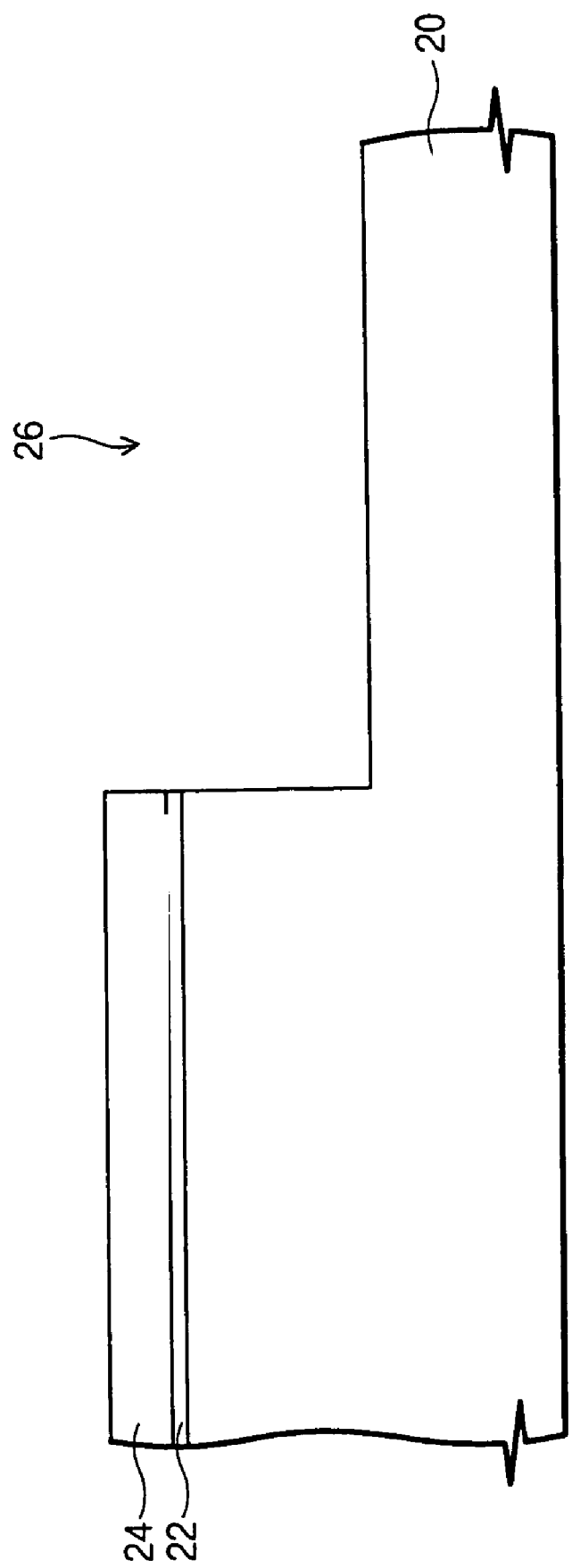

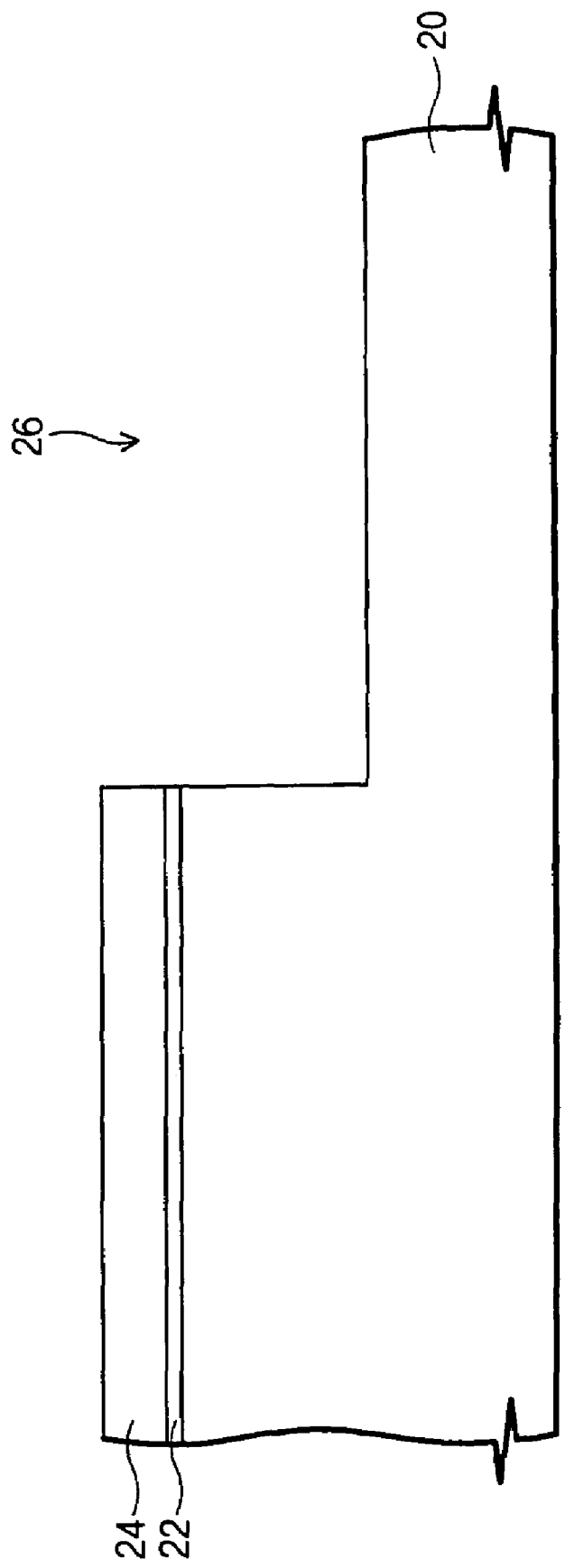

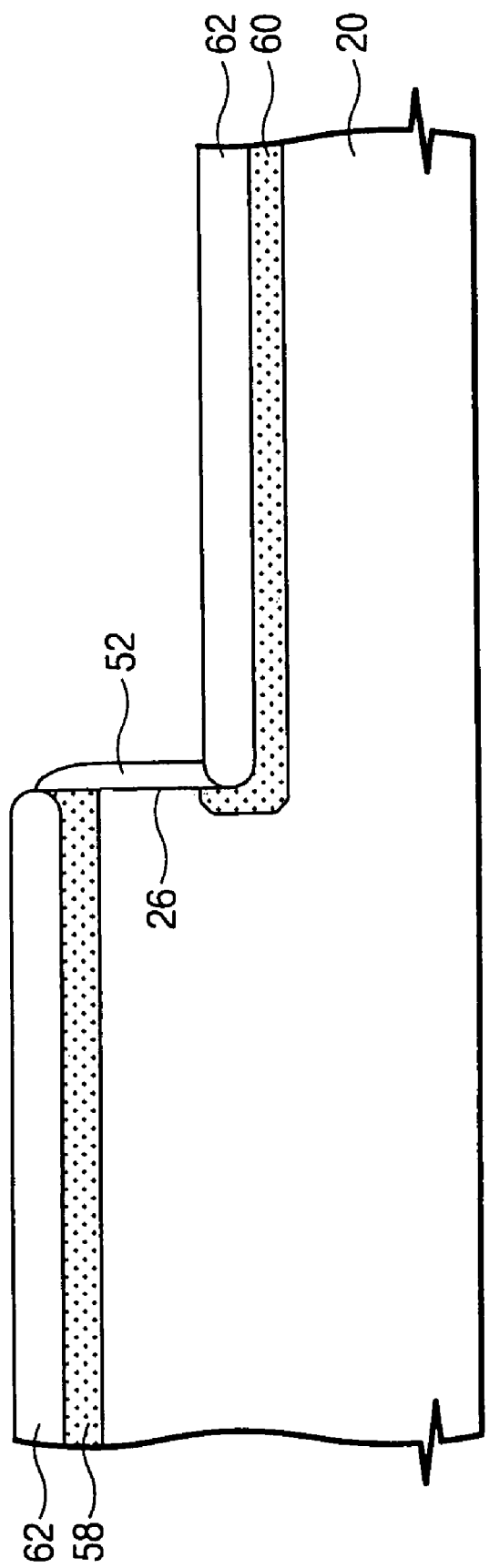

FLOATING TRAP TYPE NONVOLATILE MEMORY DEVICE AND METHOD OF FABRICATING THE SAME

This application is a divisional of, and claims priority under 35 U.S.C. § 120 on U.S. application Ser. No. 10/407,182, filed Apr. 7, 2003 now U.S. Pat. No. 6,861,685, which further claims priority under 35 U.S.C. § 119 of Korean Patent Application 2002-20344 filed on Apr. 15, 2002, the entire contents of which are hereby incorporated by reference.

FIELD OF THE INVENTION

The present invention relates to a semiconductor device and a method of fabricating the same and more particularly to a floating trap type nonvolatile memory device that has a memory cell that can store a plurality of data bits and a method of fabricating the same.

BACKGROUND OF THE INVENTION

Floating trap type nonvolatile memory devices have generally the same structure as MOS transistors and use a multi-layered insulating layer as a gate insulating layer. The multi-layered insulating layer generally includes a tunnel insulating layer, a charge trap insulating layer, and a blocking insulating layer. Conventionally, the charge trap insulating layer is made of charge trapping material such as silicon nitride. In the floating trap type nonvolatile memory device, data is stored by injecting electrons into the charge trap insulating layer. This injection may be performed by a Fowler-Nordheim (F-N) tunneling mechanism or a hot carrier injection mechanism. Conversely, data may be erased by drawing electrons from the charge trap insulating layer or injecting holes into an electron storage layer.

Multi-bit memory cells provide a mass storage device without increasing physical dimensions. Most multi-bit memory cells use a multi-level threshold voltage to store two bits or more. In another type of multi-bit memory cell, two bits are stored on both sides (electron storage regions) of a floating trap type memory device, respectively. This structure has been disclosed in the technical article entitled "A NOVEL LOCALIZED TRAPPING, 2-BIT NONVOLATILE MEMORY CELL", Boaz Eitan, Paolo Pavan, Ilan Bloom, Efraim Aloni, Aviv Frommer, and David Finzi, IEEE Electron Device Letters, Vol. 21, November 2000.

A top plan view of a conventional floating trap type multi-bit memory device is illustrated in FIG. 1, and a cross-sectional view taken along the line I-I' of FIG. 1 is illustrated in FIG. 2.

In the conventional memory device, a plurality of bitline strips 10 cross a semiconductor substrate 20 in parallel. The bitline strips 10 may be buried diffusion layers where impurities are implanted into the substrate 20. A plurality of wordlines 12 cross the bitline strips 10. Each area between the bitlines strips 10 corresponds to a channel of a transistor. A tunnel insulating layer 14, a charge trap insulating layer 16, and a blocking insulating layer 18 are sequentially stacked between the channels and the wordlines 12 to form a multi-layered insulating layer. Conventionally, the multi-layered insulating layer is made of oxide-nitride-oxide (ONO). An intersection of a pair of adjacent bitline strips 10 and a wordline 12 corresponds to a memory cell. That is, a pair of the adjacent bitline strips 10, the wordline 12, the multi-layered insulating layer sandwiched between a wordline and a semiconductor substrate correspond to a source/drain region, a gate electrode, and a gate insulating layer, respectively. Two bits B1 and B2 are stored at both sides of the gate insulating layer, respectively.

In a memory cell of the conventional memory device, a right bit is written by using a left bitline as a source and a right bitline as a drain, while a left bit is written by using a right bitline as a source and a left bitline as a drain. If a ground voltage, a gate voltage of 10V or higher, and a write voltage of about 5V are applied to a left bitline, a gate electrode, and a right bitline respectively, electrons are trapped in a charge trap insulating layer at a junction of the right bitline due to hot carrier injection. Likewise, if a ground voltage and a write voltage are applied to the right bitline and the left bitline respectively, the left bit is written. In a read operation, the left bit is read out by applying a gate voltage of about 3V, a read voltage of about 2V, and a ground voltage to the gate electrode, the right bitline, and the left bitline, respectively. Likewise, the right bit is read out by applying a ground voltage and a read voltage to the right bitline and the left bitline, respectively.

SUMMARY OF THE INVENTION

In an exemplary embodiment, the present invention is directed to a nonvolatile memory device having a higher capacity in a limited area and a fabricating method thereof.

In another exemplary embodiment, the present invention is directed to a 2-bit nonvolatile memory device without data disturbance or reduced data disturbance and a fabricating method thereof.

In another exemplary embodiment, the present invention provides a floating trap type nonvolatile memory device with a vertical or substantially vertical channel. The memory device includes a substrate having an upper surface and a lower surface. A semiconductor wall having an inclination angle formed between the surfaces and a gate electrode is covered by the semiconductor wall. A pair of buried diffusion layers are formed at the upper surface and the lower surface of the semiconductor wall, respectively. A charge trap insulating layer is sandwiched between the gate electrode and the wall. The wall between a pair of the buried diffusion layers corresponds to a channel of a semiconductor memory device.

In another exemplary embodiment, the present invention provides a method of fabricating a floating trap type nonvolatile memory device with a vertical or substantially vertical channel. A pattern having a sidewall is formed on a semiconductor substrate. A buried diffusion layer is formed on an upper portion of the sidewall, and another buried diffusion layer is formed on a lower portion of the sidewall. A charge trap insulating layer is formed at the sidewall where the buried diffusion layer is formed. A gate electrode is formed on the charge trap insulating layer. The substrate is etched to form a trench, so that the sidewall may be obtained. That is, a hard mask pattern is formed on the substrate to expose an area of the substrate. Using the hard mask pattern as an etch mask, the substrate is etched to form a trench. The hard mask pattern is then removed. A memory device with a vertical or substantially vertical channel may be formed at the sidewall of the trench. The buried diffusion layers may be formed by vertically or substantially vertical implanting impurities into a semiconductor substrate where the trench is formed.

In another exemplary embodiment, the present invention provides a non-volatile memory device with a cell array and a fabricating method thereof. The memory device includes a plurality of grooves that are formed on a semiconductor substrate in parallel. First bitline strips are formed in the substrate between the grooves, and second bitline strips are formed in the substrate beneath bottoms of the grooves. A plurality of wordlines are disposed at an upper portion of the substrate having the grooves. The wordlines cross the first and second bitline strips. A charge trap insulating layer is sandwiched between the wordlines and the substrate.

In another exemplary embodiment, the method includes etching a semiconductor substrate to form a plurality of grooves, and implanting impurities into the substrate to form a first bitline strip at the substrate between the grooves and to form a second bitline strip at a bottom of the grooves. A multi-layered insulating layer including the charge trap insulating layer is conformally formed on a surface (possibly the entire surface) of a semiconductor substrate where the first and second bitline strips are formed. A gate conductive layer is formed on a entire surface (possibly the entire surface) of a semiconductor substrate where the multi-layered insulating layer is formed. The gate conductive layer is patterned to form wordlines crossing the first and second bitline strips. The first and second bitline strips may be formed by vertically or substantially vertically implanting impurities into the substrate where the grooves are formed. The multi-layered insulating layer may be comprised of a tunnel oxide layer, a charge trap insulating layer, and a blocking oxide layer which are sequentially stacked. Thus, the charge trap insulating layer can be isolated from the wordlines and the substrate.

BRIEF DESCRIPTION OF THE DRAWINGS

FIG. 5A, FIG. 6A, FIG. 7A, FIG. 8A, and FIG. 9A are flow diagrams showing the steps of fabricating a nonvolatile memory device according to an exemplary embodiment of the present invention, which are taken along the line II-II' of FIG. 3.

FIG. 5B, FIG. 6B, FIG. 7B, FIG. 8B, and FIG. 9B are flow diagrams showing the steps of fabricating a nonvolatile memory device according to an exemplary embodiment of the present invention, which are taken along the line III-III' of FIG. 3.

FIG. 10B, FIG. 11B, FIG. 12B, FIG. 13B, FIG. 14B, FIG. 15B, and FIG. 16B are flow diagrams showing the steps of fabricating a nonvolatile memory device according to another exemplary embodiment of the present invention, which are taken along the line III-III' of FIG. 3.

DETAILED DESCRIPTION OF EXEMPLARY EMBODIMENTS OF THE INVENTION

Figure 1:
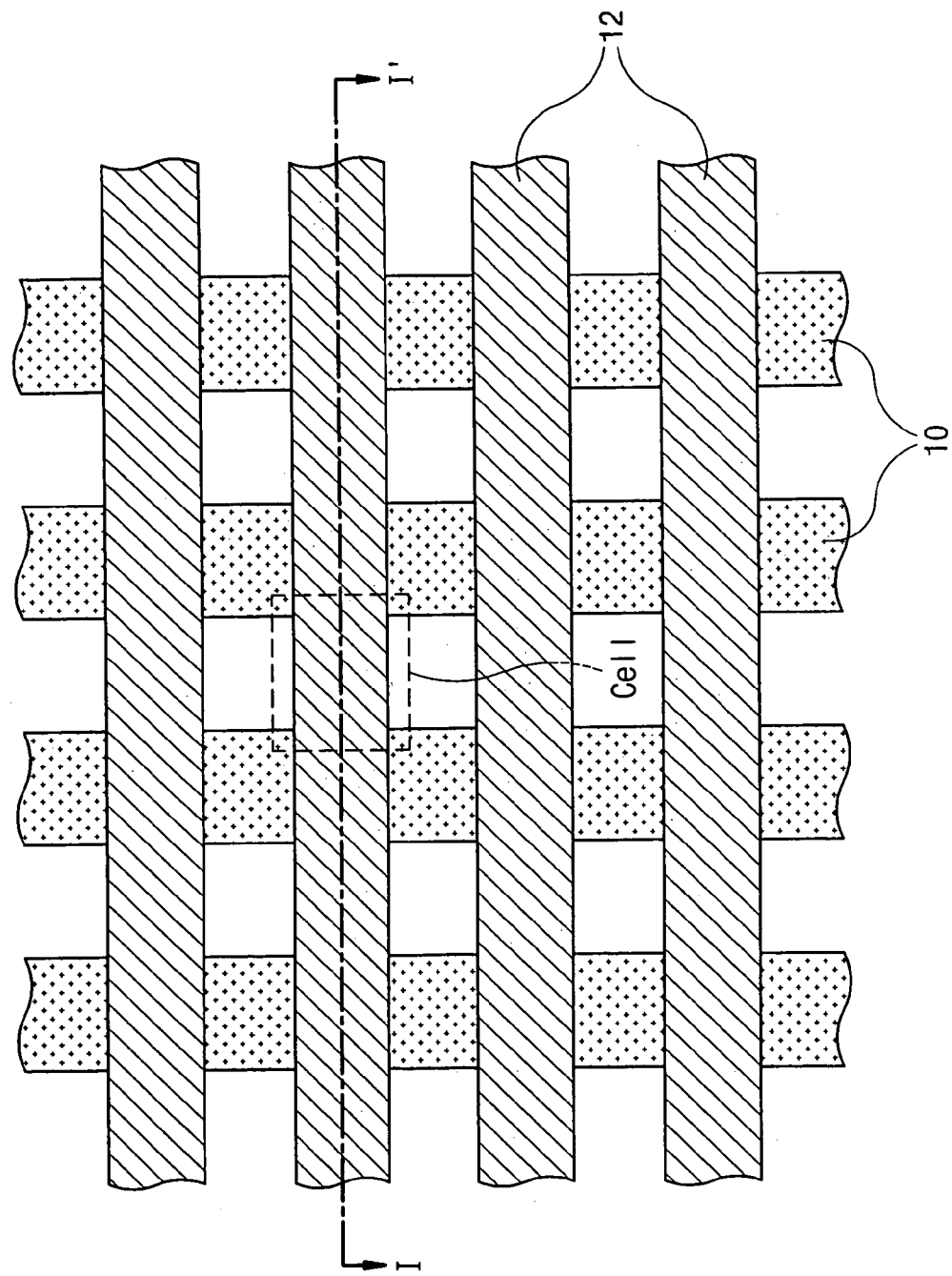
FIG. 1 is a top plan view of a conventional floating trap type multi-bit memory device.
Figure 2:
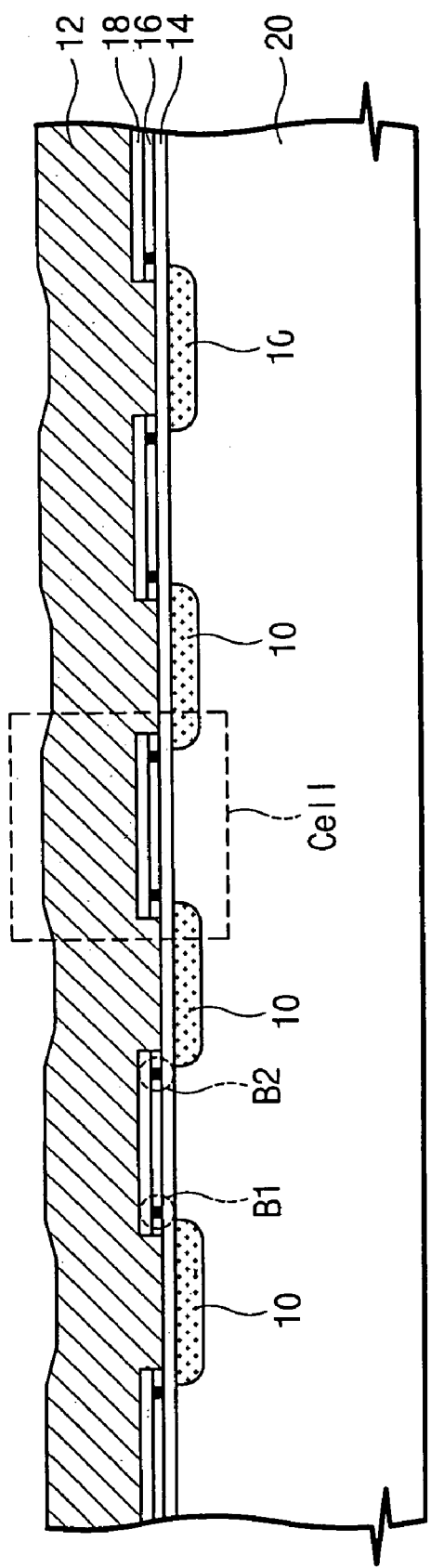
FIG. 2 is a cross-sectional view of the conventional floating trap type multi-bit memory device, which is taken along the line I-I' of FIG. 1

The present invention will now be described more fully hereinafter with reference to the accompanying drawings, in which exemplary embodiments of the invention are shown. The present invention may be embodied in different forms and should not be construed as being limited to the exemplary embodiments set forth herein. Rather, these exemplary embodiments are provided for the purpose of illustration. The present invention covers various changes in form and detail as will be readily contemplated by those skilled in the art. It will also be understood that when a layer is referred to as being "on" another layer or substrate, it can be directly on the other layer or substrate, or intervening layers may also be present. The same reference labels will be used throughout the Figures to denote similar components.

It should also be noted that the thickness of layers and regions in the memory device have been exaggerated in the drawings for the purpose of clarity.

Figure 3:
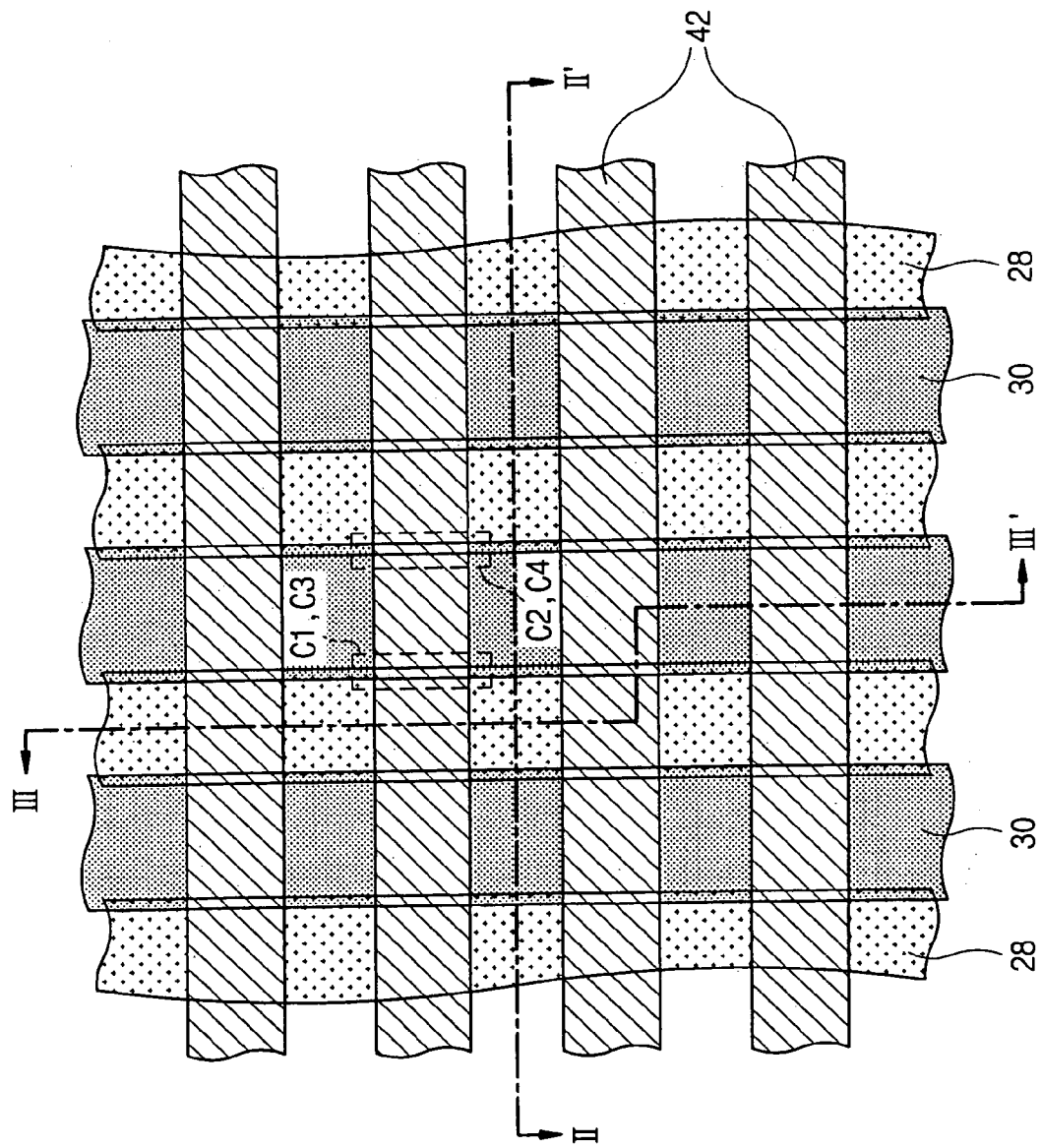
FIG. 3 is a top plan view for explaining a nonvolatile memory device according to an exemplary embodiment of the present invention.
Figure 4:
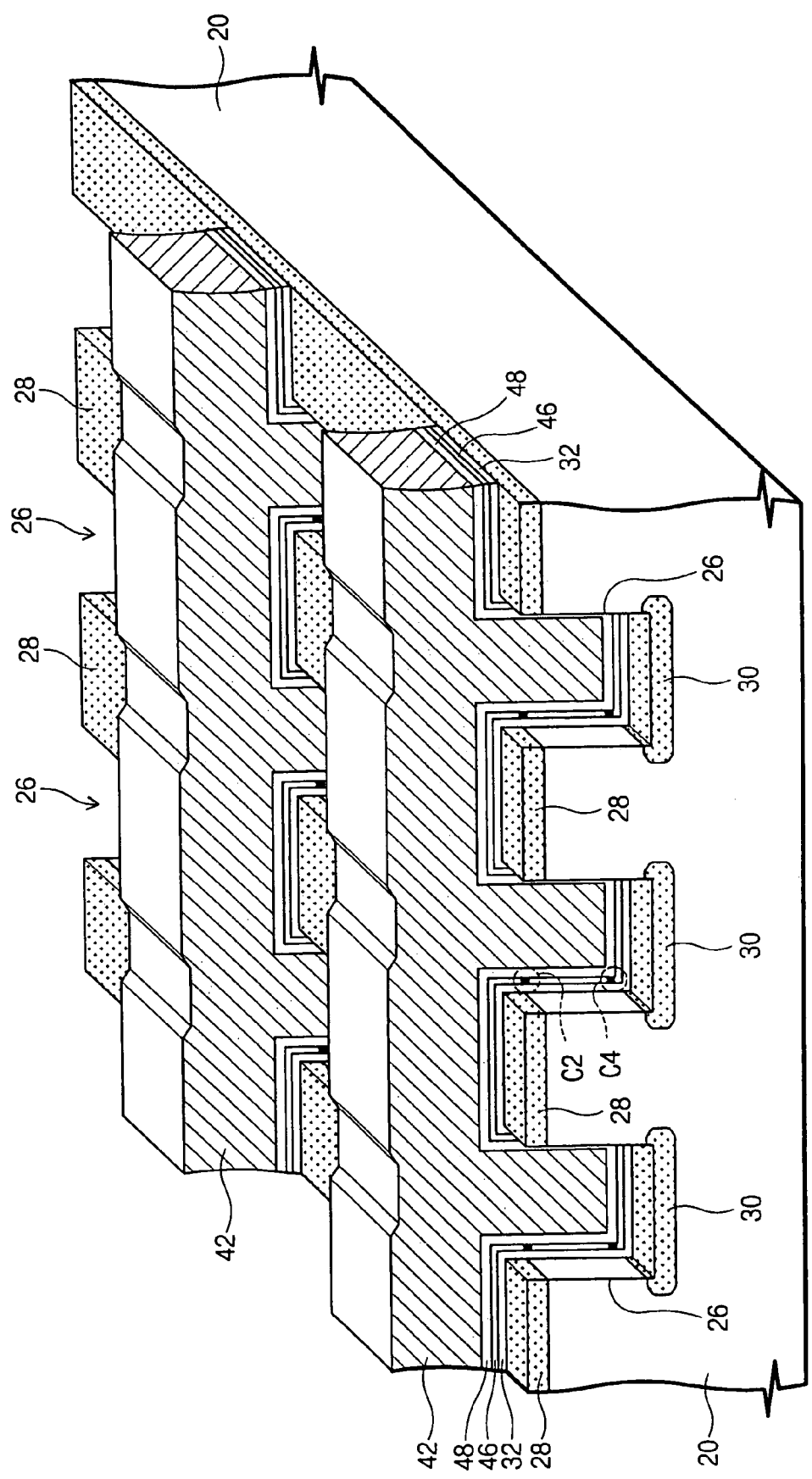
FIG. 4 is a perspective view of a nonvolatile memory device according to an exemplary embodiment of the present invention.

FIG. 3 is a top plan view for illustrating a nonvolatile memory device according to an exemplary embodiment of the present invention, and FIG. 4 is a perspective view of a nonvolatile memory device according to an exemplary embodiment of the present invention.

Referring to FIG. 3 and FIG. 4, a nonvolatile memory device according to an exemplary embodiment of the present invention includes first bitline strips 28 and second bitline strips 30 which are alternatively arranged on a semiconductor substrate 20. A plurality of grooves 26 are arranged on the substrate 20 in parallel, thus form an upper surface (semiconductor substrate between the grooves 26) and lower surface (bottoms of the grooves) on the substrate 20. The first bitline strips 28 may be formed on the upper surface and second bitline strips 30 may be formed on the lower surface, respectively. The first and second bitline strips 28 and 30 may form a buried diffusion layer that is formed by implanting impurities into a semiconductor substrate. A plurality of wordlines cross the substrate 20 including the grooves 26. A tunnel insulating layer 32, a charge trap insulating layer 46, and a blocking insulating layer 48 may be sequentially stacked and may be sandwiched between the wordlines 42 and the substrate 20. The tunnel insulating layer 32 and the blocking insulating layer 46 are, as an example, made of silicon oxide. The charge trap insulating layer 46 may include at least one silicon nitride layer. In an exemplary memory device, channels may be formed at sidewalls of the grooves 26. That is, the second bitline strip 30 formed at the lower surface on the substrate and the first bitline strip 28 formed at the upper surface on the substrate correspond to a source/drain region of a memory cell. The wordline 42 disposed in the grooves 26 corresponds to a gate of the memory cell. Since the two bits C2 and C4 are stored at one sidewall of each groove and two bits C1 and C3 are stored at another sidewall, the memory device makes it possible to achieve a high integration density as compared to the conventional art. Further, a depth of each groove may be adjusted to reduce or eliminate bit-to-bit interference.

A method of fabricating the nonvolatile memory device according to an exemplary embodiment of the invention is described below with reference to FIG. 5A, FIG. 6A, FIG. 7A, FIG. 8A, and FIG. 9A which are cross-sectional views taken along the line II-II' of FIG. 3 and FIG. 5B, FIG. 6B, FIG. 7B, FIG. 8B, and FIG. 9B which are cross-sectional views taken along the line III-III' of FIG. 3.

Figure 5A:
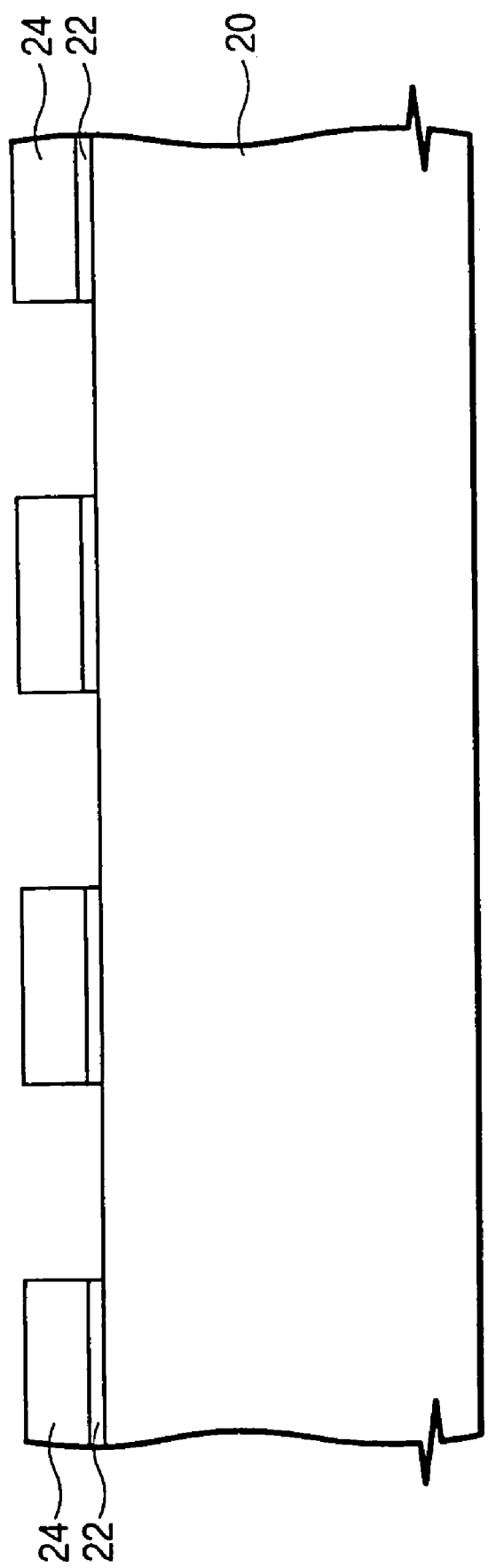

Referring to FIG. 5A and FIG. 5B, mask patterns 24 (for example a hard mask pattern) are formed on a semiconductor substrate 20. The hard mask patterns 24 are band-shaped in one direction to expose the substrate 20. The hard mask patterns 24 may be made of an insulator (e.g., silicon nitride) having an etch selectivity with respect to the substrate 20. Also the hard mask patterns 24 may be comprised of a plurality of material layers whose uppermost layer or layers may be a photoresist. In one example, a buffer oxide layer 22 is sandwiched between the hard mask pattern 24 and the substrate 20 to reduce or prevent stress from being applied to the substrate 20.

Referring to FIG. 6A and FIG. 6B, by using the hard mask pattern 24 as an etching mask, the substrate 20 may be etched to form a plurality of grooves 26 that are arranged in parallel. The grooves 26 may have a depth that is appropriate for the operation characteristics of semiconductor devices, as would be known to one of ordinary skill in the art.

Figure 7A:
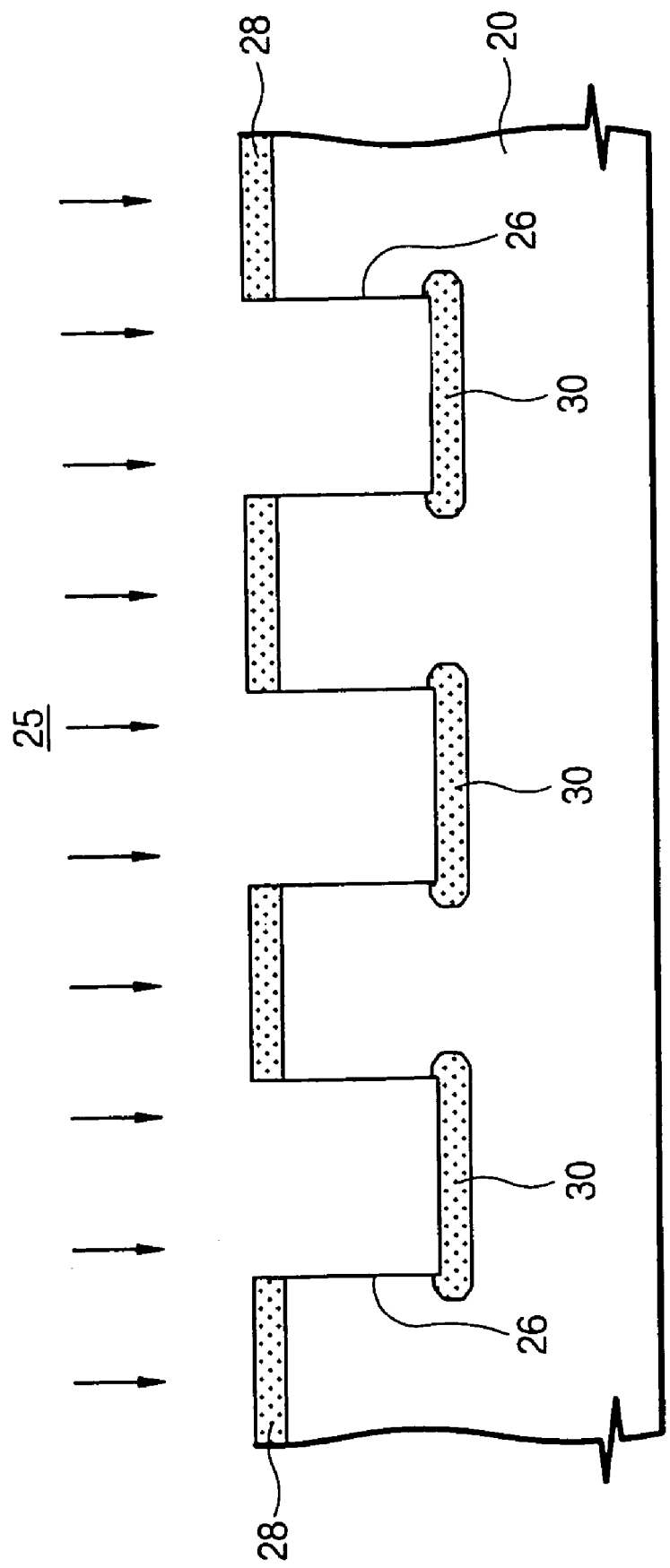
Figure 7B:
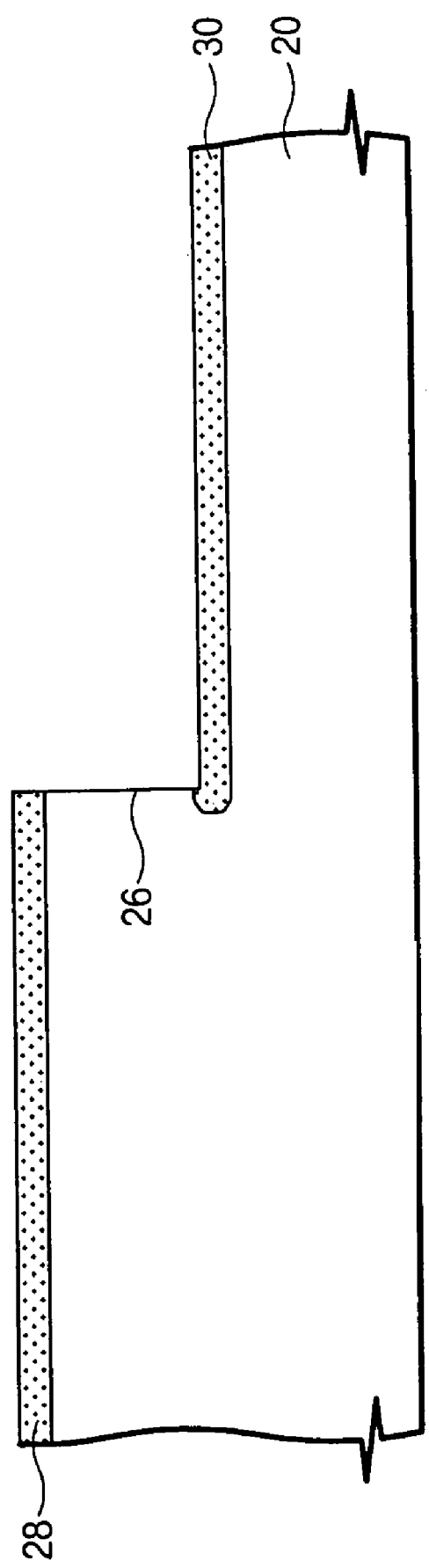

Referring to FIG. 7A and FIG. 7B, the hard mask pattern 24 and the buffer oxide layer 22 may be removed to expose the substrate 20 between the grooves 26 (not shown). In this case, the buffer oxide layer 22 may be left. If made of silicon nitride, the hard mask pattern 24 may be removed by a wet etch technique using a phosphoric solution. While the substrate 20 is etched to form the grooves 26, the substrate 20 may suffer from etch damage. Accordingly, the substrate 20 may be annealed to cure defects that may occur at sidewalls and bottoms of the grooves 26.

A plurality of first bitline strips 28 and a plurality of second bitline strips 30 may be formed by implanting impurities 25 into a surface of the substrate 20. Alternatively, the first and second bitline strips 28 and 30 may be formed by vertically or substantially vertically implanting impurities 25 with or without a photolithographic process. After implanting the impurities 25, the substrate 20 may be annealed to activate the impurities 25 and lower a resistance of the bitlines. As a result, the first bitline strips 28 may be formed at a semiconductor substrate between the grooves 26 and the second bitline strips 30 may be formed at bottoms of the grooves 26. The first and second bitline strips 28 and 30 may be alternately arranged in parallel with one another.

Figure 8A:
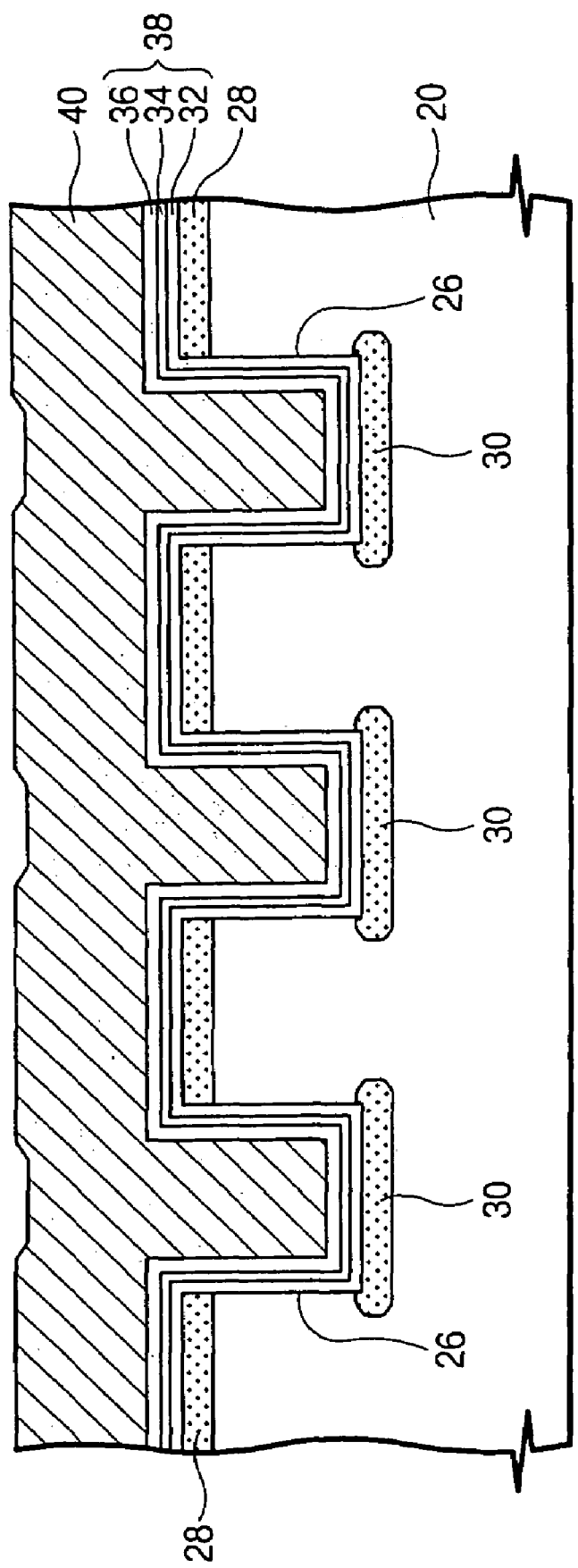
Figure 8B:
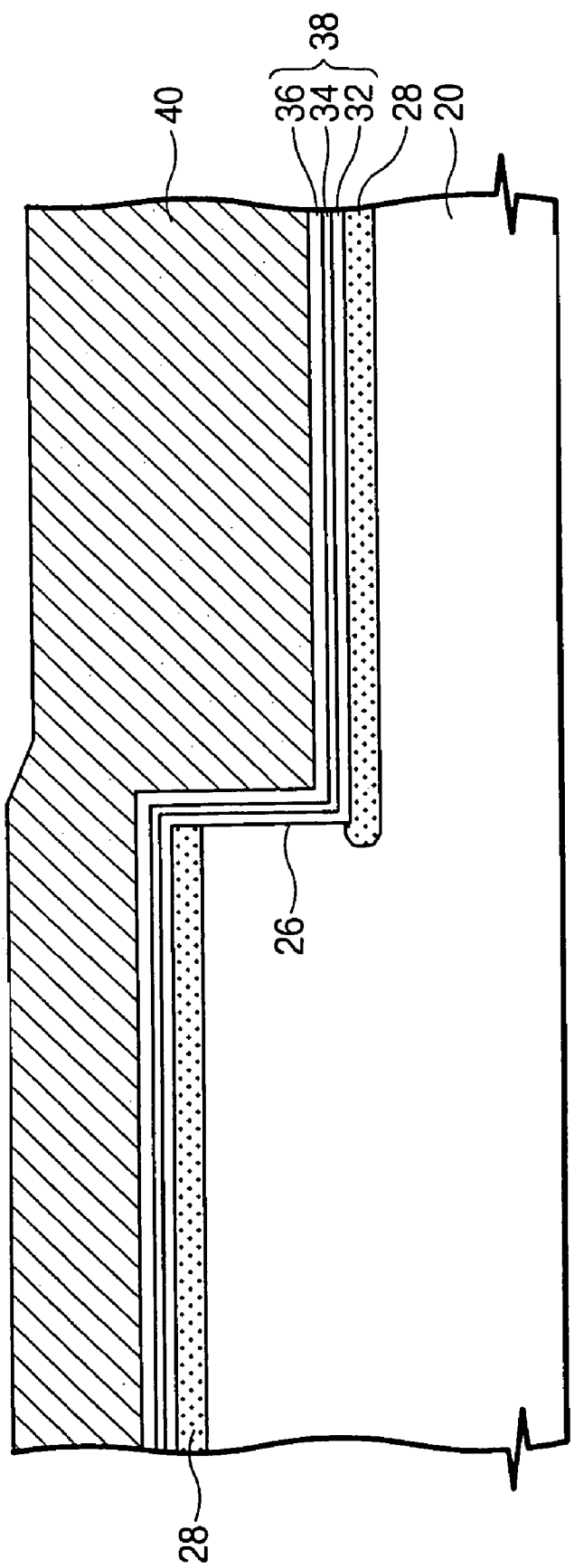

Referring to FIG. 8A and FIG. 8B, a lower insulating layer 32, an interlayer dielectric 34, and an upper insulating layer 36 may be sequentially and/or conformally stacked on a surface (possibly the entire surface) of a semiconductor substrate where the first and second bitline strips 28 and 30 are formed. The lower insulating layer 32, the interlayer dielectric 32, and the upper insulating layer 36 (and possibly other layers) may constitute a multi-layered insulating layer 38. The lower insulating layer 32 may correspond to a tunnel insulating layer of a nonvolatile memory device. The interlayer dielectric 34 and the upper insulating layer 36 may correspond to a charge trap insulating layer and a blocking insulating layer of the nonvolatile memory device, respectively. The upper and lower insulating layers 32 and 36 may be, for example, made of silicon oxide, and the interlayer dielectric 34 may be, for example, made of insulator including at least one silicon nitride. The multi-layered insulating layer 38 may have an influence on a threshold voltage and a data retention characteristic of a memory device. Thus, following formation of the bitline strips 28 and 30, the multi-layered insulating layer 38 may be formed shortly after cleaning the surface of the semiconductor substrate.

A gate conductive layer 40 may be formed on an entire surface of a semiconductor substrate where the multi-layered insulating layer 38 is formed. The gate conductive layer 40 may be made of doped polysilicon or metal polycide or metal compound. The metal polycide may be a compound of materials selected from the group consisting of tungsten (W), titanium (Ti), tantalum (Ta), and molybdenum (Mo).

Figure 9A:
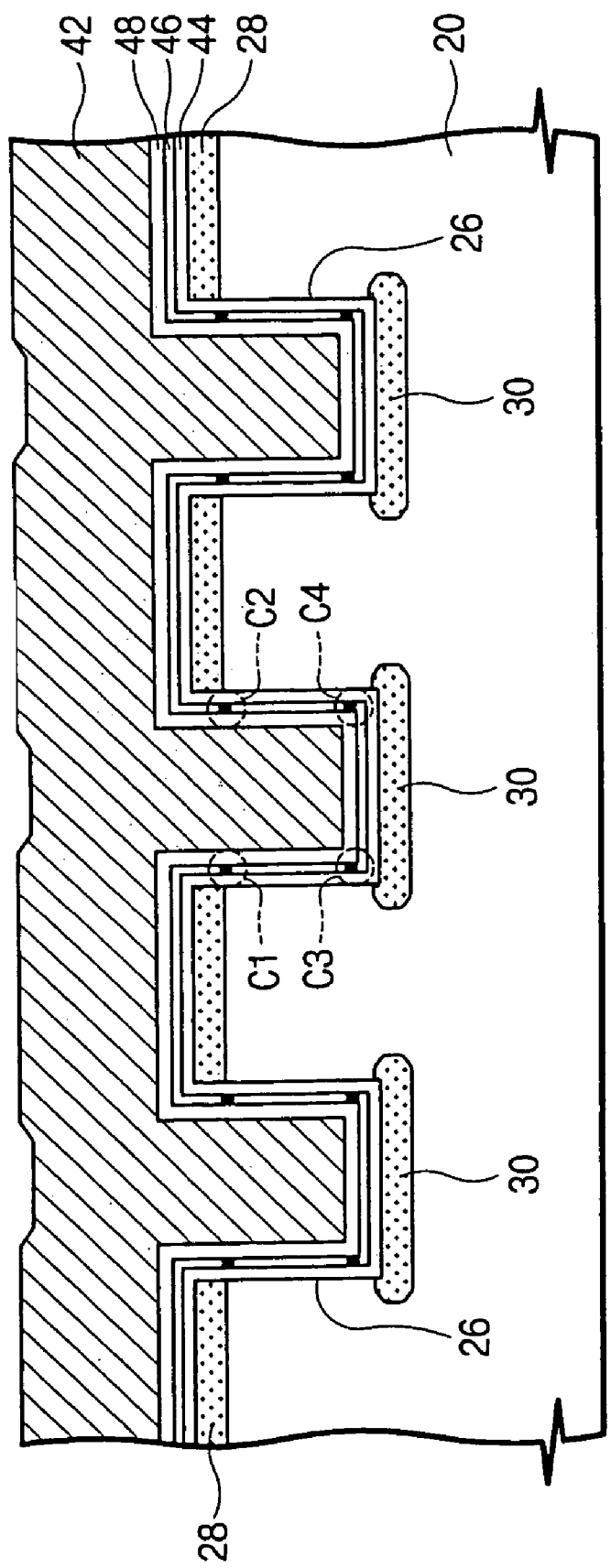
Figure 9B:
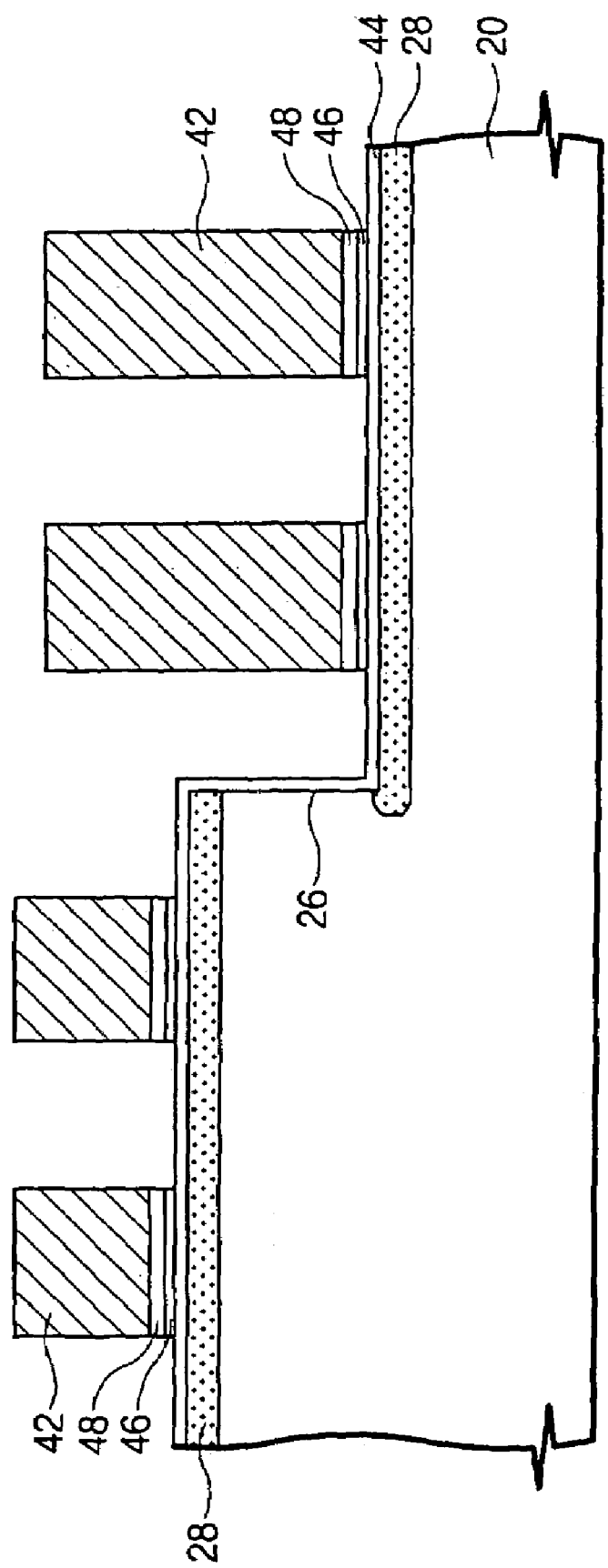

Referring to FIG. 9A and FIG. 9B, the gate conductive layer 40 may be patterned to form a plurality of wordlines 42 crossing the first bitline strips 28 and the second bitline strips 30. The wordlines 42 may be disposed in parallel with one another. The upper insulating layer and the interlayer dielectric may be etched to form a charge trap insulating layer 46 and a blocking insulating layer 48 that are sequentially stacked between the wordlines 42 and the semiconductor substrate. When the charge trap insulating layer 46 is successively disposed between wordlines, unanticipated trap charges may remain when an operation cycle of a memory device is repeated. The lower insulating layer 44 disposed under the wordlines 42 corresponds to a tunnel insulating layer of a memory cell.

In the memory device according to exemplary embodiments of the present invention, channels are vertically or substantially vertically formed at the sidewalls of the grooves 26, and one bit may be written into an upper portion of the respective sidewalls and another bit may be written into a lower portion thereof, as illustrated in FIGS. 5-9. As a result, the memory device may include four data bits C1, C2, C3, and C4 in the same horizontal dimensions as the conventional art.

A method of fabricating the nonvolatile memory device according to another exemplary embodiment of the present invention is described below with reference to FIG. 10A, FIG. 11A, FIG. 12A, FIG. 13A, FIG. 14A, FIG. 15A, and FIG. 16A which are cross-sectional views taken along the line II-II' of FIG. 3 and FIG. 10B, FIG. 11B, FIG. 12B, FIG. 13B, FIG. 14B, FIG. 15B, and FIG. 16B which are cross-sectional views taken along the line III-III' of FIG. 3.

Figure 10A:
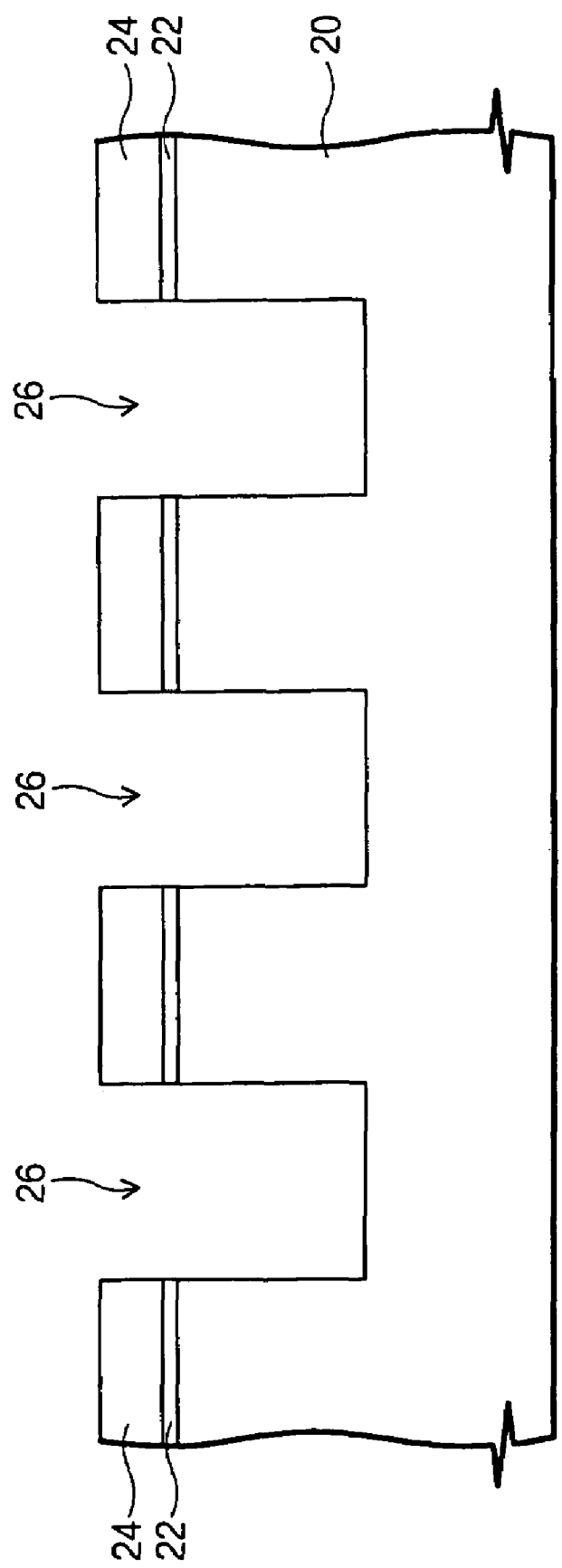
FIG. 10A, FIG. 11A, FIG. 12A, FIG. 13A, FIG. 14A, FIG. 15A, and FIG. 16A are flow diagrams showing the steps of fabricating a nonvolatile memory device according to another exemplary embodiment of the present invention, which are taken along the line II-II' of FIG. 3.

Referring to FIG. 10A and FIG. 10B, a buffer oxide layer 22 and a mask pattern 24 (possibly a hard mask) are formed on a semiconductor substrate 20. By using the hard mask pattern 24 as an etching mask, the substrate 20 may be etched to form a plurality of grooves 26 that are arranged in parallel.

Figure 11A:
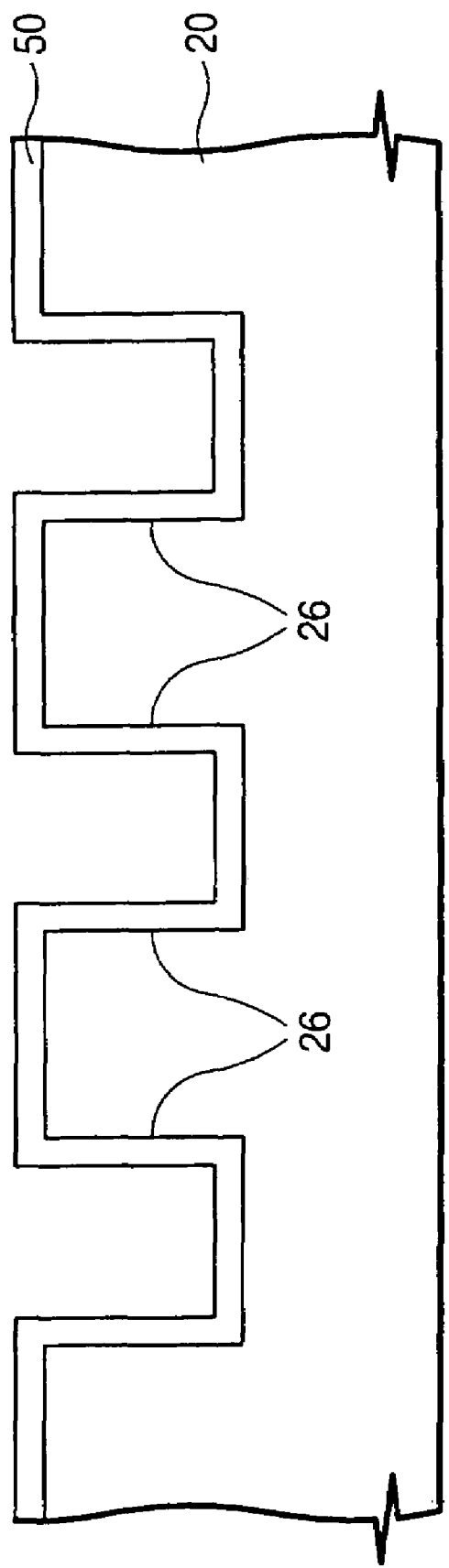
Figure 11B:
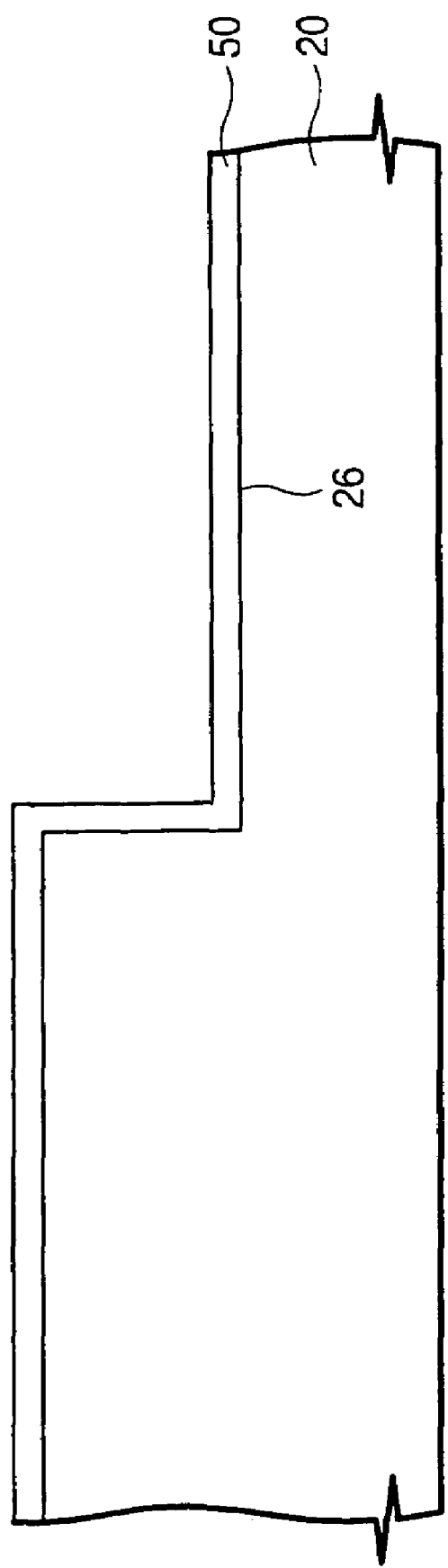

Referring to FIG. 11A and FIG. 11B, the hard mask pattern 24 and the buffer oxide layer 22 may be removed to expose a semiconductor substrate between the grooves 26. An oxidation barrier layer 50 may be conformally formed on a surface (for example, the entire surface) of the substrate 20. The oxidation barrier layer 50 may be made of an insulator having a low thermal oxidation rate, e.g., silicon nitride.

Figure 12A:
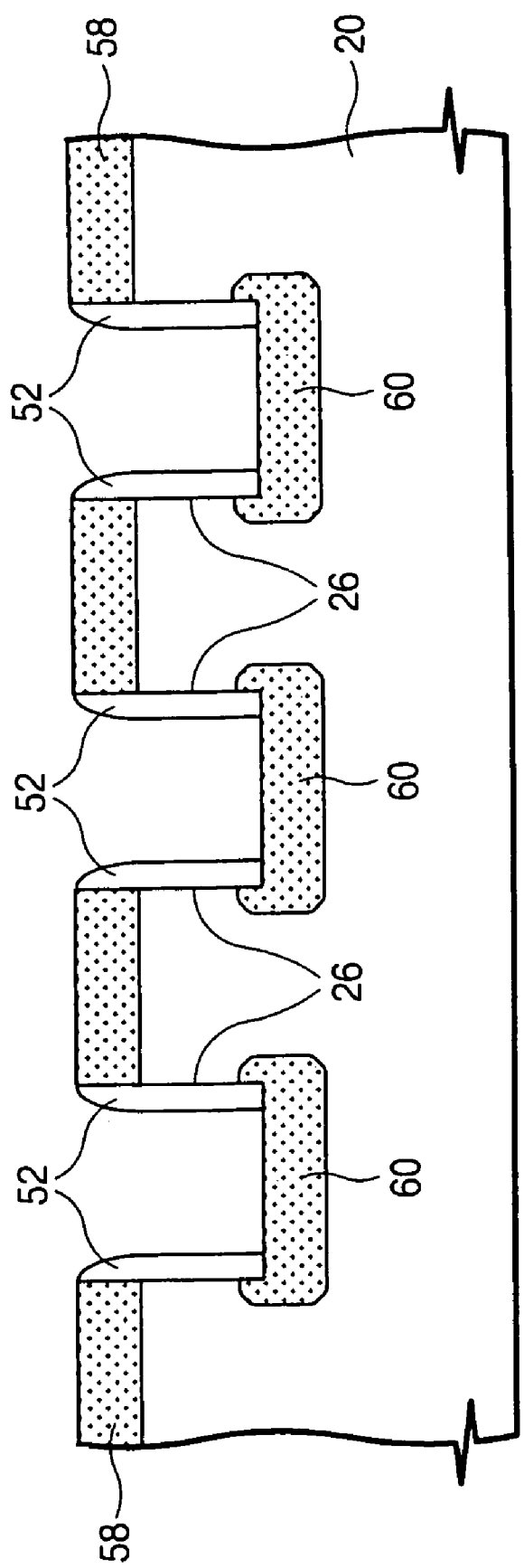
Figure 12B:
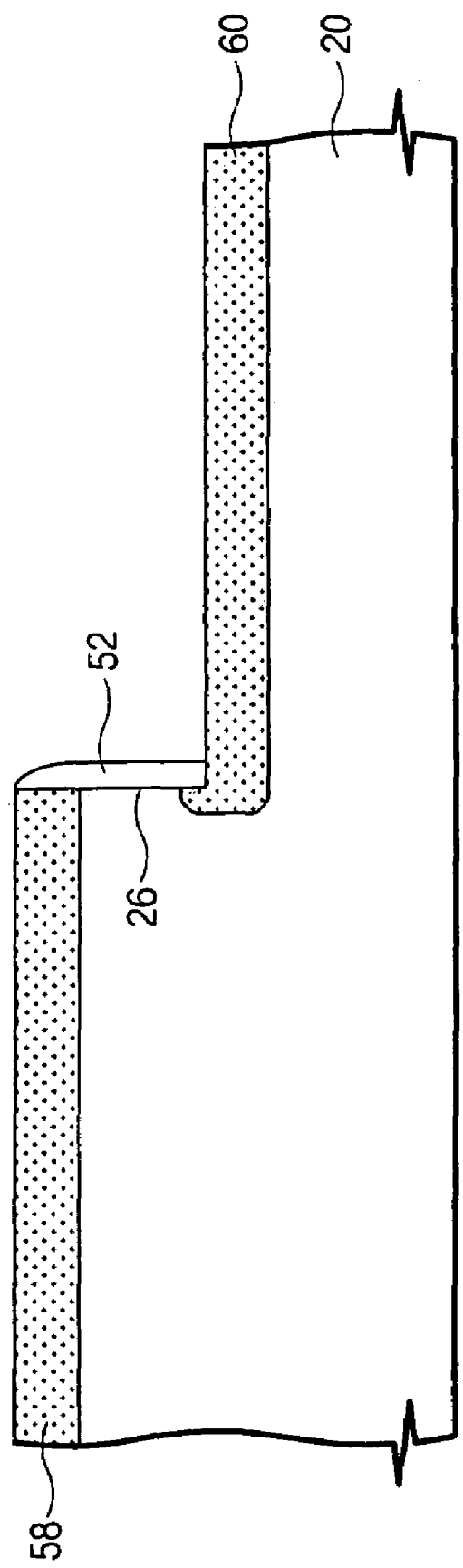

Referring to FIG. 12A and FIG. 12B, the oxidation barrier layer 50 may be anisotropically etched to expose a semiconductor substrate between the grooves 26 and bottoms of the grooves 26. As a result, insulating layer patterns 52 may be formed to cover or substantially cover sidewalls of the grooves 26. The insulating layer patterns 52 may be thin so that more of the bottoms of the grooves 26 between the insulating layer patterns 52 can be exposed. Therefore, the oxidation barrier layer 50 may have a reduced or even minimal thickness to reduce or prevent thermal oxidation of a semiconductor substrate covered with the insulating layer patterns 52. Impurities may be vertically or substantially vertically implanted into a surface of the substrate 20 to form first bitline strips 58 at a semiconductor substrate between the grooves 26 and form second bitline strips 60 at bottoms of the grooves 26.

Figure 13A:
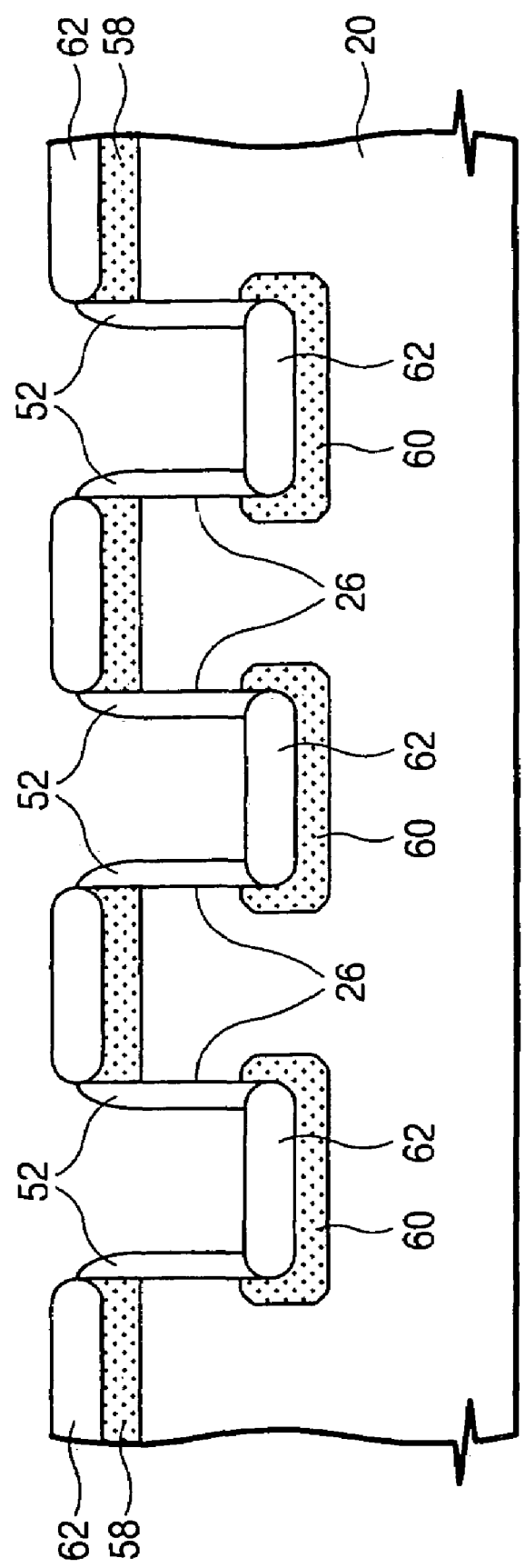
Figure 14A:
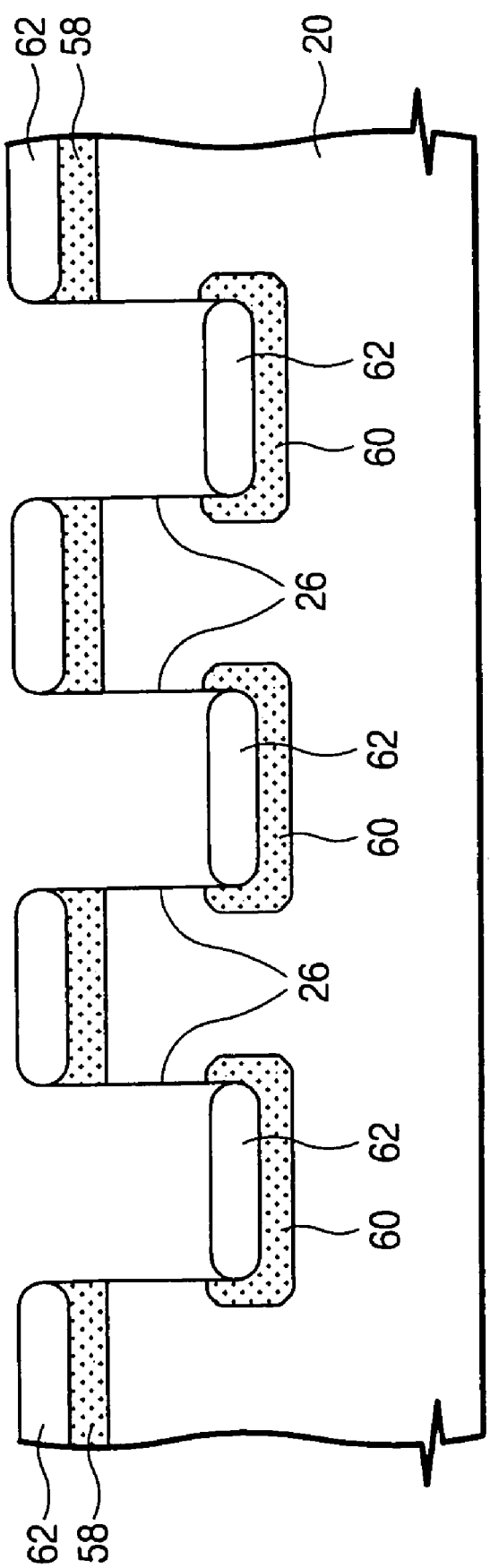
Figure 14B:
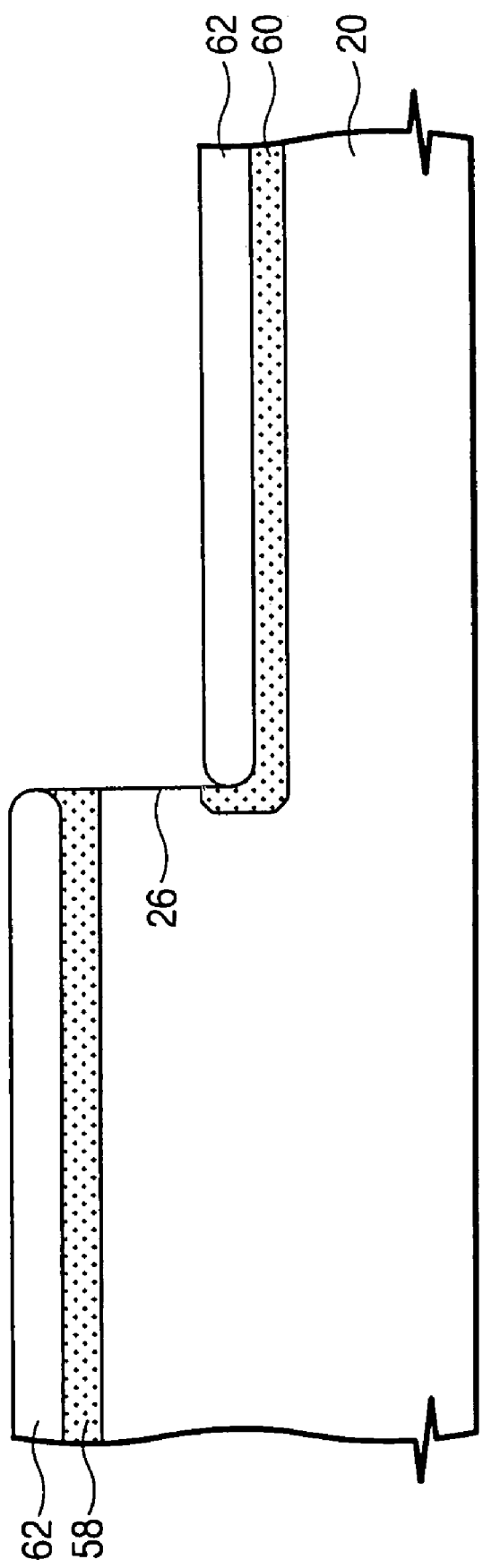
Figure 15A:
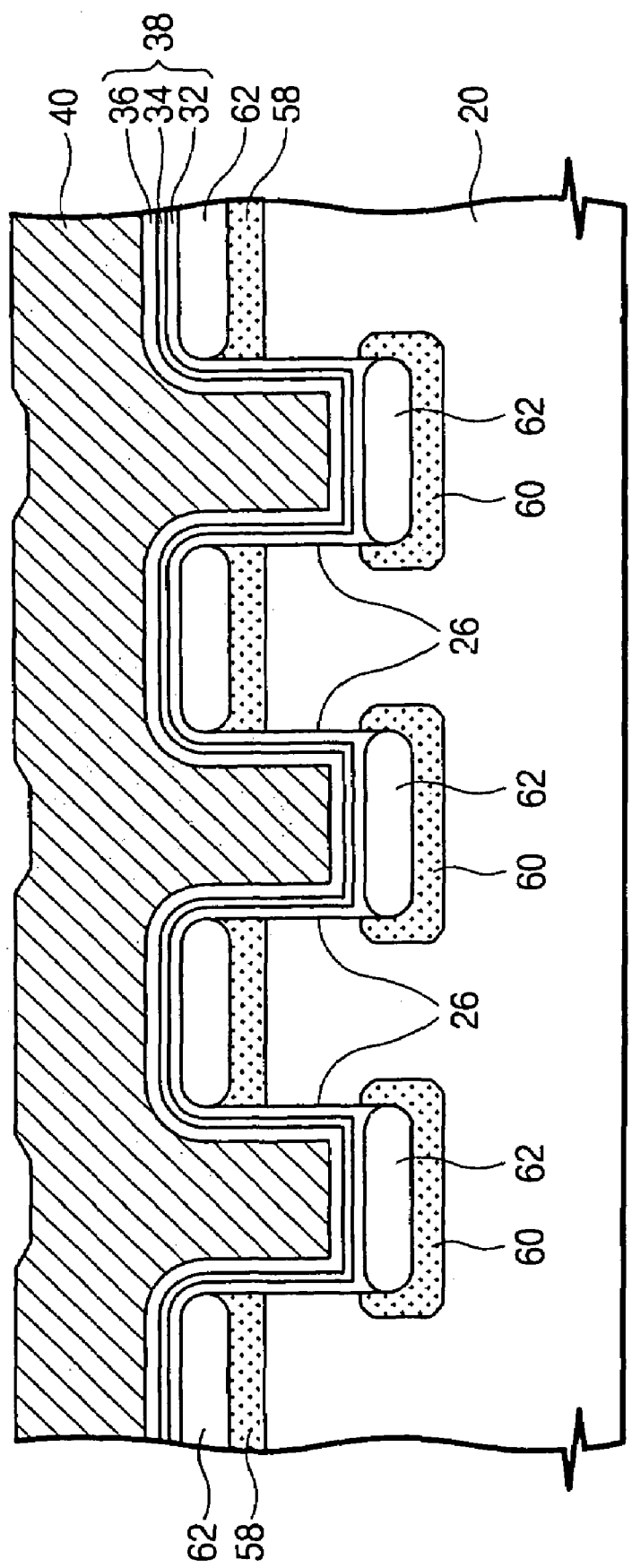
Figure 15B:
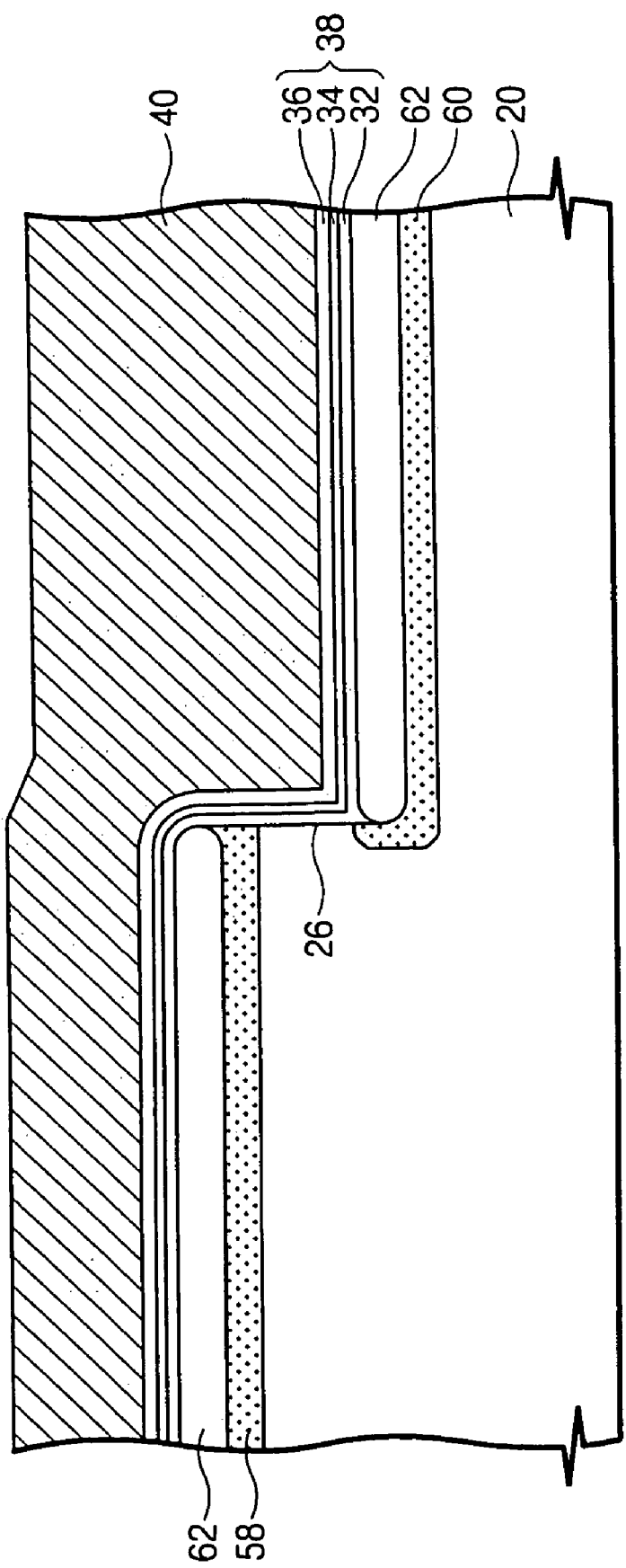

Referring to FIG. 13A and FIG. 13B, using the insulating layer pattern 52 as a mask, the semiconductor substrate 20 may be annealed to form a bitline oxide layer 62 at a semiconductor substrate between the grooves 26 and the bottoms of the grooves 26. During this process, impurities implanted into a surface of the semiconductor substrate are diffused and activated. Thus, the second bitline strips 60 may cover the bitline oxide layer 62 formed at the bottoms of the grooves 26 and partially overlap sidewalls of the grooves 26.

Referring to FIG. 14A, FIG. 14B, FIG. 15A, and FIG. 15B, the insulating layer patterns 52 may be removed to expose the sidewalls of the grooves 26. If made of silicon nitride, the insulating layer patterns 52 may be removed by a wet etch technique using a phosphoric acid solution. A multi-layered insulating layer 38 may then be conformally formed on a surface (possibly the entire surface) of a semiconductor substrate where the sidewalls of the grooves 26 are exposed. The multi-layered insulating layer 38 may be comprised of a lower insulating layer 32, an interlayer dielectric 34, and an upper insulating layer 36 that are sequentially stacked. The lower and upper insulating layers 32 and 36 may be made of silicon oxide. The interlayer dielectric 34 may be made of insulator including at least one silicon oxide. The multi-layered insulating layer 38 may be formed shortly after cleaning the substrate of the semiconductor substrate. A gate conductive layer 40 may be formed on a surface (possibly the entire surface) of a semiconductor substrate where the multi-layered insulating layer 38 is formed.

Figure 16A:
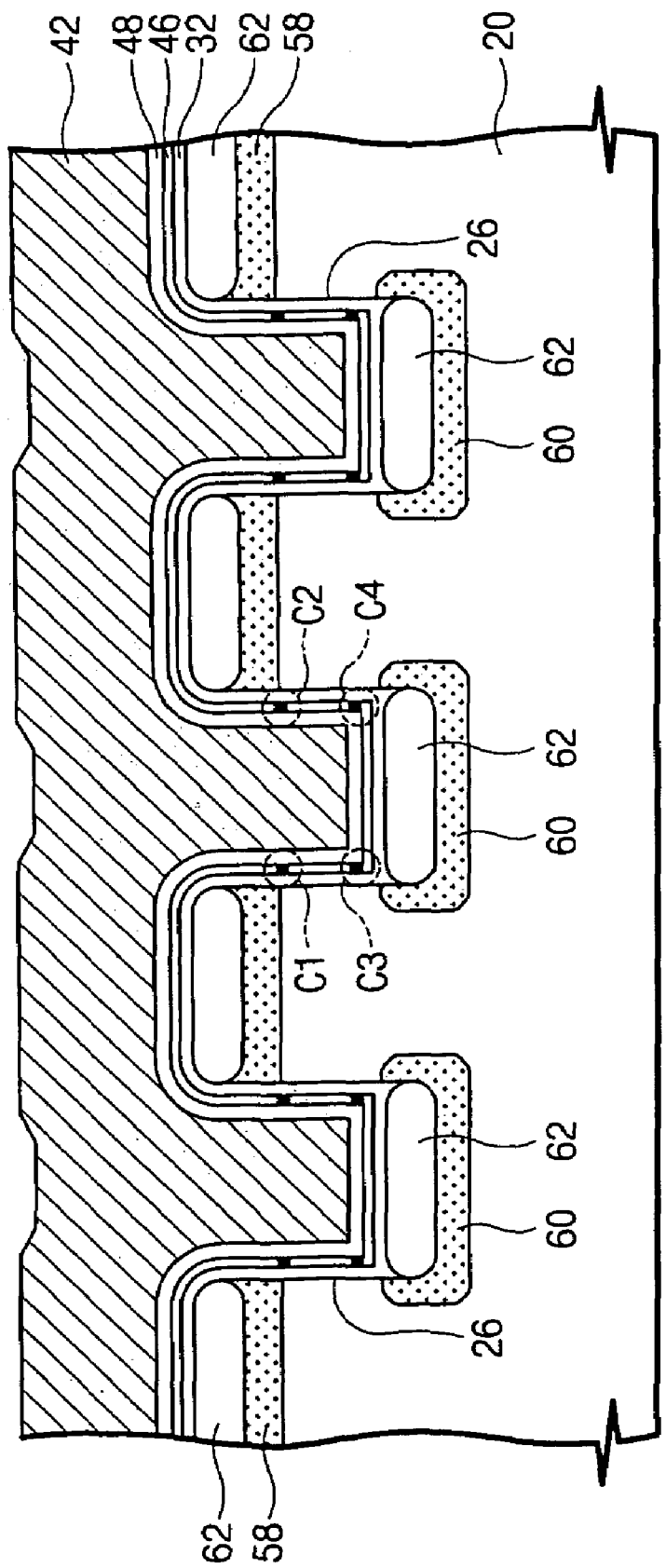
Figure 16B:
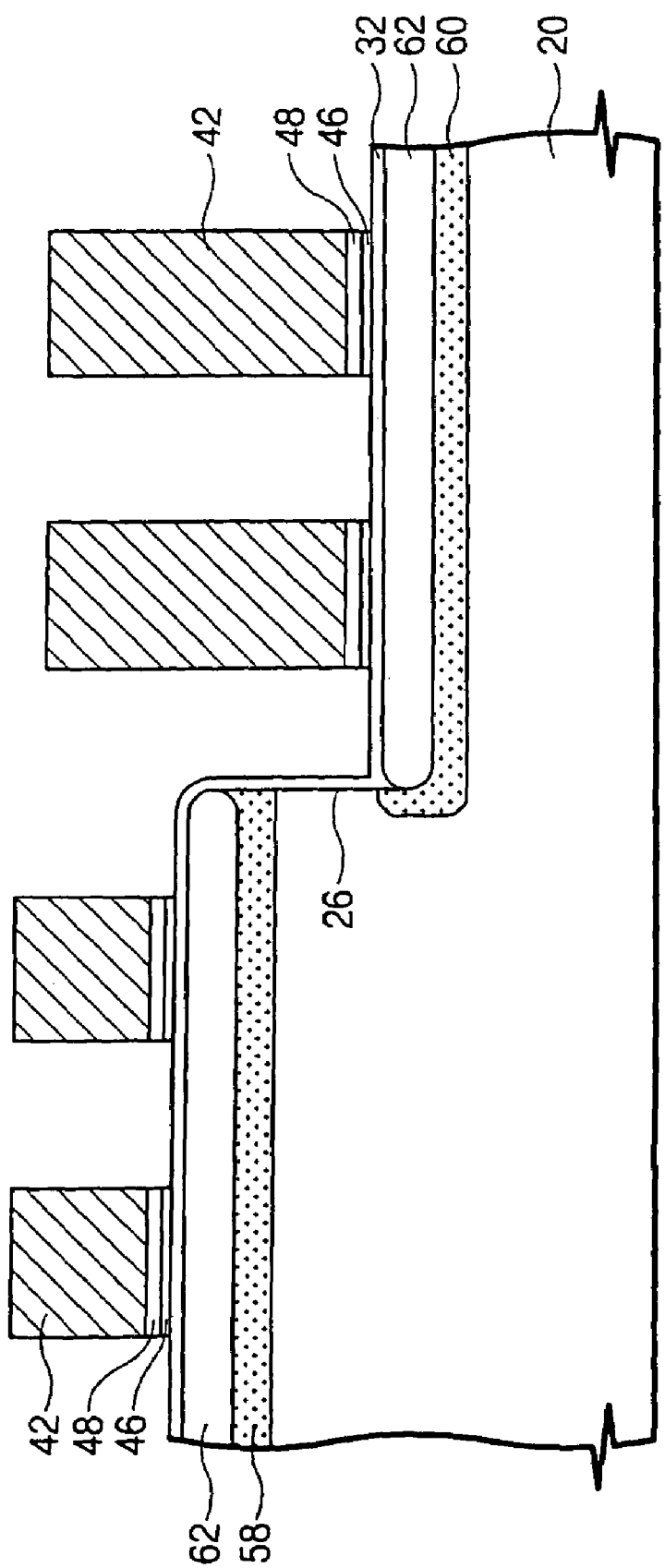

Referring to FIG. 16A and FIG. 16B, the gate conductive layer 40 may be patterned to form a plurality of wordlines 42 crossing the first bitline strips 58 and the second bitline strips 60. The upper insulating layer and the interlayer dielectric 34 may be patterned to form a charge trap insulating layer 46 and a blocking insulating layer 48 that are sequentially stacked beneath the wordlines 42. Unlike the first exemplary embodiment, bitline oxide layers 62 may be sandwiched between the wordline 42 and the first bitline strips 58 and between the wordline 42 and the second bitline strips 60, respectively, as illustrated in FIGS. 10-16. The bitline oxide layers 62 may suppress a coupling phenomenon caused by a parasitic capacitor between the wordline 42 and the bitline strips 58 and 60, reducing or preventing data disturbance in a memory cell array.

As explained above, in a memory device having a floating trap type memory cell, a cell transistor with a vertical or substantially vertical channel is formed to achieve a higher integration density in a limited dimension. Further, since a channel length of the cell transistor can be increased without extending an area of a memory cell array, a bit-to-bit interference of a 2-bit memory cell can be reduce or prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a nonvolatile memory device, comprising:
   forming a pattern having sidewalls on a semiconductor substrate, to form an upper surface and a lower surface on the substrate;
   forming buried diffusion layers at the upper surface and the lower surface;
   forming bitline insulating layers at the semiconductor substrate on the upper surface and the lower surface excluding the sidewalls between a bottom surface of the bitline insulating layer on the upper surface and a top surface of the bitline insulating layer on the lower surface;
   forming a charge trap insulating layer at the sidewalls; and
   forming a gate electrode on the charge trap insulating layer
   wherein forming bitline insulating layers includes:
   conformally forming an oxidation barrier layer on a surface or an entire surface of the semiconductor substrate where the buried diffusion layers are formed;
   anisotropically etching the oxidation barrier layer to form insulating layer patterns covering the sidewalls of the pattern;
   annealing the semiconductor substrate including the insulating layer patterns to form a thermal oxide layer at the semiconductor substrate exposed between the insulating layer patterns; and
   removing the insulating layer patterns.

2. The method of claim 1, wherein forming the pattern having the sidewalls includes:
   forming a hard mask pattern on the semiconductor substrate to expose an area of the semiconductor substrate;
   etching the semiconductor substrate to form a trench, using the hard mask pattern as an etching mask; and
   removing the hard mask pattern;
   wherein the sidewalls of the trench corresponds to sidewalls of the hard mask pattern.

3. The method of claim 2, wherein the buried diffusion layer is formed by vertically or substantially vertically implanting impurities into the semiconductor substrate in a direction normal or substantially normal to the sidewalls.

4. The method of claim 2, further comprising:
   prior to forming the charge trap insulating layer, forming a tunnel oxide layer covering the sidewalls; and
   forming a blocking insulating layer covering the charge trap insulating layer.

5. A method of fabricating a nonvolatile memory device, comprising:
   etching a semiconductor substrate to form a plurality of grooves having sidewalls, to form an upper surface and a lower surface on the substrate;
   implanting impurities into the semiconductor substrate where the grooves are formed, forming a first bitline strip at the semiconductor substrate between the grooves and forming a second bitline strip at bottoms of the grooves;
   forming bitline insulating layers at the upper surface of the semiconductor substrate and bottoms of the grooves excluding the sidewalls between bottom surfaces of the bitline insulating layers at the upper surface of the semiconductor substrate and top surfaces of the bitline insulating layers on the bottoms of the grooves;
   conformally forming a multi-layered insulating layer including a charge trap insulating layer on a surface or entire surface of the semiconductor substrate where the first and second bitline strips are formed;
   forming a gate conductive layer on a surface or an entire surface of the semiconductor substrate where the multi-layered insulating layer is formed; and
   patterning the gate conductive layer to form word lines crossing the first and second bitline strips,
   wherein forming the bitline insulating layers includes:
   conformally forming an oxidation barrier aver on a surface or an entire surface of the semiconductor substrate where first and second bitline strips are formed;
   anisotropically etching the oxidation barrier aver to form insulating aver patterns covering the sidewalls of the grooves:
   annealing the semiconductor substrate including the insulating aver patterns to form a thermal oxide aver at the semiconductor substrate exposed between the insulating aver patterns; and
   removing the insulating aver patterns.

6. The method of claim 5, wherein forming the grooves includes:
   forming a hard mask pattern on the semiconductor substrate to expose areas of the semiconductor substrate in one direction;

etching the semiconductor substrate to form a plurality of grooves arranged in parallel, using the hard mask pattern as an etching mask; and removing the hard mask pattern.

7. The method of claim 5, wherein the first and second bitline strips are formed by vertically implanting impurities into a semiconductor substrate where the grooves are formed.

8. The method of claim 5, wherein the multi-layered insulating layer includes a tunnel insulating layer, a charge trap insulating layer, and a block insulating layer which are sequentially stacked.

9. The method of claim 8, wherein the tunnel insulating layer and the blocking insulating layer are made of silicon oxide and the charge trap insulating layer is made of silicon nitride.

10. The method of claim 8, wherein the charge trap insulating layer is made of at least one silicon nitride.

11. The method of claim 5, following forming the wordlines, further comprising etching the charge trap insulating layer between the wordlines.

12. The method of claim 5, wherein the oxidation barrier layer is made of silicon nitride.

13. The method of claim 1, wherein at least one data bit is written into an upper portion of the sidewalls and at least one data bit is written into a lower portion of the sidewalls.

14. The method of claim 13, wherein at least two data bits are stored on each side of the sidewalls.

15. The method of claim 5, wherein at least one data bit is written into an upper portion of the sidewalls and at least one data bit is written into a lower portion of the sidewalls.

16. The method of claim 15, wherein at least two data bits are stored on each side of the sidewalls.

* * * * *